US012609651B2

(12) United States Patent
Mette et al.

(10) Patent No.: US 12,609,651 B2
(45) Date of Patent: Apr. 21, 2026

(54) PHOTOVOLTAIC MODULE AND A METHOD OF MANUFACTURING THE SAME

(71) Applicant: HANWHA Q CELLS GMBH, Bitterfeld-Wolfen (DE)

(72) Inventors: Michael Mette, Bitterfeld-Wolfen (DE); Thoralf Harder, Bitterfeld-Wolfen (DE)

(73) Assignee: HANWHA Q CELLS GMBH, Bitterfeld-Wolfen (DE)

( * ) Notice: Subject to any disclaimer, the term of this patent is extended or adjusted under 35 U.S.C. 154(b) by 64 days.

(21) Appl. No.: 18/264,957

(22) PCT Filed: Feb. 8, 2022

(86) PCT No.: PCT/EP2022/052964
§ 371 (c)(1),
(2) Date: Aug. 10, 2023

(87) PCT Pub. No.: WO2022/171602
PCT Pub. Date: Aug. 18, 2022

(65) Prior Publication Data
US 2024/0056024 A1 Feb. 15, 2024

(30) Foreign Application Priority Data
Feb. 10, 2021 (DE) ..................... 10 2021 103 099.4

(51) Int. Cl.
*H02S 40/34* (2014.01)
*H10F 19/90* (2025.01)

(52) U.S. Cl.
CPC ........... *H02S 40/34* (2014.12); *H10F 19/902* (2025.01)

(58) Field of Classification Search
CPC ............................... H02S 40/34; H10F 19/902
See application file for complete search history.

(56) References Cited

U.S. PATENT DOCUMENTS

| | | | | |
|---|---|---|---|---|
| 2005/0016579 A1* | 1/2005 | Elazari | .................... | H02S 40/38 |
| | | | | 136/244 |
| 2009/0283137 A1* | 11/2009 | Croft | ....................... | H10F 19/00 |
| | | | | 136/251 |
| 2010/0078057 A1* | 4/2010 | Karg | ....................... | H10F 19/75 |
| | | | | 136/244 |
| 2011/0100414 A1* | 5/2011 | Moon | ................... | H10F 19/902 |
| | | | | 136/244 |

(Continued)

FOREIGN PATENT DOCUMENTS

| | | |
|---|---|---|
| CN | 109301010 A | 2/2019 |
| DE | 10 2011 055 754 A1 | 12/2012 |
| EP | 2 249 394 A1 | 11/2010 |

*Primary Examiner* — Sadie White
(74) *Attorney, Agent, or Firm* — Christensen, Fonder, Dardi & Busse PLLC

(57) ABSTRACT

A photovoltaic module includes several cell rows of serially connected photovoltaic cells and one or more bypass components. The cell rows are arranged next to each other perpendicular to a current direction which is formed in the serially connected photovoltaic cells during operation and are connected in such a way that at least two adjacent cell rows comprise the same current direction. The one or more bypass components bypass at least one of the adjacent cell rows of the same current direction.

6 Claims, 4 Drawing Sheets

(56)                References Cited

U.S. PATENT DOCUMENTS

| | | | | |
|---|---|---|---|---|
| 2011/0239450 A1* | 10/2011 | Basol | H10F 19/902 | |
| | | | | 29/729 |
| 2012/0060895 A1* | 3/2012 | Rubin | H10F 19/902 | |
| | | | | 136/246 |
| 2012/0318319 A1* | 12/2012 | Pinarbasi | H10F 77/937 | |
| | | | | 257/E33.001 |
| 2012/0325288 A1* | 12/2012 | Jang | H10F 19/80 | |
| | | | | 136/246 |
| 2013/0206203 A1* | 8/2013 | Lommasson | H10F 19/902 | |
| | | | | 438/59 |
| 2015/0101649 A1* | 4/2015 | Liu | H10F 19/902 | |
| | | | | 136/244 |
| 2015/0349703 A1* | 12/2015 | Morad | H02S 20/25 | |
| | | | | 136/251 |
| 2017/0054047 A1 | 2/2017 | Morad et al. | | |
| 2018/0006602 A1* | 1/2018 | Bunea | H02S 40/34 | |
| 2019/0296171 A1* | 9/2019 | Chang | H10F 77/211 | |

* cited by examiner forming a plurality of cell rows of serially connected photovoltaic cells ⸺ S110 bridging at least one of the adjacent cell rows of the same current direction with a bypass diode ⸺ S120

PHOTOVOLTAIC MODULE AND A METHOD OF MANUFACTURING THE SAME

PRIORITY CLAIM

The present application is a National Phase entry of PCT Application No. PCT/EP2022/052964, filed Feb. 8, 2022, which claims priority from German Patent Application No. 10 2021 103 099.4, filed Feb. 10, 2021, the disclosures of which are hereby incorporated by reference herein in their entirety.

FIELD OF THE INVENTION

The present invention relates to a photovoltaic module and to a method for its manufacture and, in particular, to a connection scheme for photovoltaic cells (solar cells) with bypass diodes.

BACKGROUND

When exposed to sunlight, solar cells generate free charge carriers that allow current to flow through the solar cell. If shading occurs, no charge carriers are released in the shaded solar cells, so that the current flow is interrupted there, or a higher resistance occurs. If the other solar cells, which are connected in series with the shaded solar cell, continue to produce current, this leads to increased heat generation and, in extreme cases, to destruction of the corresponding solar cells. To avoid this, so-called bypass diodes are formed to bypass the cells with high resistance so that these cells are protected. When sufficient light energy is available again, more charge carriers are released and the bypass diodes lock again.

FIG. 4 shows an exemplary conventional connection of solar cells 405 with bypass diodes 430, wherein the solar cells 405 (or half-cells) are connected in such a way that during operation a meandering current flow I1, I2, ... results between a first terminal 41 and a second terminal 42. Specifically, the solar cells 405 are serially connected in a plurality of cell rows 410, 420, 430, ... 460. The cell rows perpendicular to the current direction I1, I2, ... are arranged side by side, with adjacent cell rows 410, 420 comprising an opposite current direction I1, I2. The bypass diodes 430 bypass the adjacent cell rows 410, 420 of opposite current directions I1, I2.

Mirror-symmetrically to this interconnection of cell rows 410, 420, 430, ... further solar cells are connected in a lower part in the same way, the mirror plane running along the connecting line between the first and the second terminal 41, 42. Thus, in this conventional arrangement, a bypass diode 430 bridges four cell rows of solar cells 405 each, two cell rows vertically above and two cell rows vertically below the bypass diode 430. In the example shown in FIG. 4, there are a total of three bypass diodes 430 bridging 156 solar cells or half cells in 12 cell rows, as an example.

This conventional interconnection has the disadvantage that relatively large sections of the photovoltaic module are bridged by one bypass diode 430. In particular, these sections extend over the entire vertical height of the photovoltaic module. Shading causes a cell row to shut down when it reaches a relevant size. Due to the described relatively large sections, the electrical power of the photovoltaic module reduces relatively strong in the case of such shading. Another effect is that the electrical power of the cell row subject to shading is consumed by the bypass diode within the cell row. This can result in heat generation in the shaded cell(s) (i.e., the cells that are in the shade). This heat generation is largely dependent on the size of the shading as well as the electrical output of a photovoltaic module. Since the modules are not only getting bigger, but also more powerful, a shading of one cell can already result in a very large heat development.

Therefore, there is a need for photovoltaic modules that can bridge flexible, smaller areas with bypass diodes.

SUMMARY OF THE INVENTION

At least part of the above problems is solved by a photovoltaic module according to the claims and a method for its manufacture according to the claims. The dependent claims relate to advantageous further embodiments of the subject matter of the independent claims.

The present invention relates to a photovoltaic module including a plurality of cell rows of serially connected photovoltaic cells (solar cells) and one or more bypass components. The cell rows are arranged adjacent to each other perpendicular to a current direction that is formed during operation of the series-connected photovoltaic cells and are connected such that at least two adjacent cell rows comprise a same current direction. The bypass components bridge at least one of the adjacent cell rows of the same current direction. In particular, the adjacent cell rows can be connected in parallel with one another.

In the context of the present invention, a current direction is to be understood as a straight line along which the cell rows of photovoltaic cells are arranged and connected in series, thus indicating the main current direction. At the ends of the cell rows, the direction of the current is diverted and the current then runs in the opposite direction. Furthermore, the term adjacent cell rows is understood that no further solar cells are arranged between these cell rows and ideally the solar cells are adjoined to each other. Apart from electrical insulation, no gap should be formed. Therefore, the multiple rows are optionally arranged adjacent to each other without any gap.

Optionally, the one or more bypass components are housed in a laminate together with the cell rows of the photovoltaic module or in a separate box. The box may be an external box (e.g., a junction box or junction socket) that is attached to the laminate or to an optional frame. The bypass component may include at least one of the following:
  a bypass diode,
  a transistor (e.g. a field effect transistor like a MOSFET),
  an electronic circuit (e.g. a current or voltage regulator for setting a defined current or voltage).

Although the invention is not intended to be limited thereto, in the following a diode is most often used as bypass component. It is understood that in all embodiments, the exemplary bypass diode may be replaced by another bypass component.

Optionally, perpendicular to the direction of current, the exemplary bypass diodes are arranged next to each other (e.g., at an equal vertical height). For example, they can be arranged selectively in a specific area, such as the central area or the edge area, of the photovoltaic module. Since the connection lines for the bypass diodes can be laid as desired, all bypass diodes of a photovoltaic module can also be integrated centrally in one connection box. Advantageously, the bypass diodes are arranged on a rear side of the photovoltaic module, i.e. opposite to the direction of light incidence.

The bypass diodes can also be arranged anti-parallel to the current direction of the at least two adjacent cell rows of the same current direction. Anti-parallel connection means that the bypass diodes are connected in reverse direction along the current direction. Therefore, the bypass diodes do not carry current during normal operation, but only during exemplary shading when a large voltage drop occurs, whereby the shaded solar cells are protected.

Optionally, the photovoltaic module includes at least one connection point or junction box (or junction socket) in a corner area or in another area of the photovoltaic module to electrically connect the photovoltaic module. For example, if the bypass diodes are already integrated into the laminate, only one connection point needs to be formed as a contact point to electrically contact the photovoltaic module there.

With this interconnection of the bypass diodes, it is possible to partition the photovoltaic module as desired. For example, any number of cell rows can be arranged perpendicular to the current direction and/or any number of cell rows can be arranged in the current direction. In this way, areas of any size can be switched off by a bypass diode.

Optionally, the photovoltaic cells are half-cells (or other subdivisions) manufactured by a separation process of a whole photovoltaic cell. Thus, the photovoltaic cell may have any shape (for example, square or non-square shapes). Within a cell row, the photovoltaic cells can be electrically connected in series with connectors. However, they can also lie with their edges on top of each other for contacting (so-called shingling). The number of cell rows and cells/half cells within a cell row can be chosen arbitrarily.

Embodiments also relate to a method of manufacturing a photovoltaic module. The method includes:

forming a plurality of cell rows of serially connected photovoltaic cells, the cell rows being arranged adjacent to each other perpendicular to a current direction formed through the serially connected photovoltaic cells during operation and connected such that at least two adjacent cell rows comprise a same current direction; and bridging at least one of the adjacent cell rows of the same current direction by means of one or more bypass diodes.

All previously mentioned features of the photovoltaic module can be implemented as further optional process steps.

BRIEF DESCRIPTION OF THE DRAWINGS

The embodiments of the present invention will be better understood from the following detailed description and accompanying drawings, which, however, should not be construed as limiting the disclosure to the specific embodiments, but are merely for explanation and understanding.

DETAILED DESCRIPTION

Figure 1:
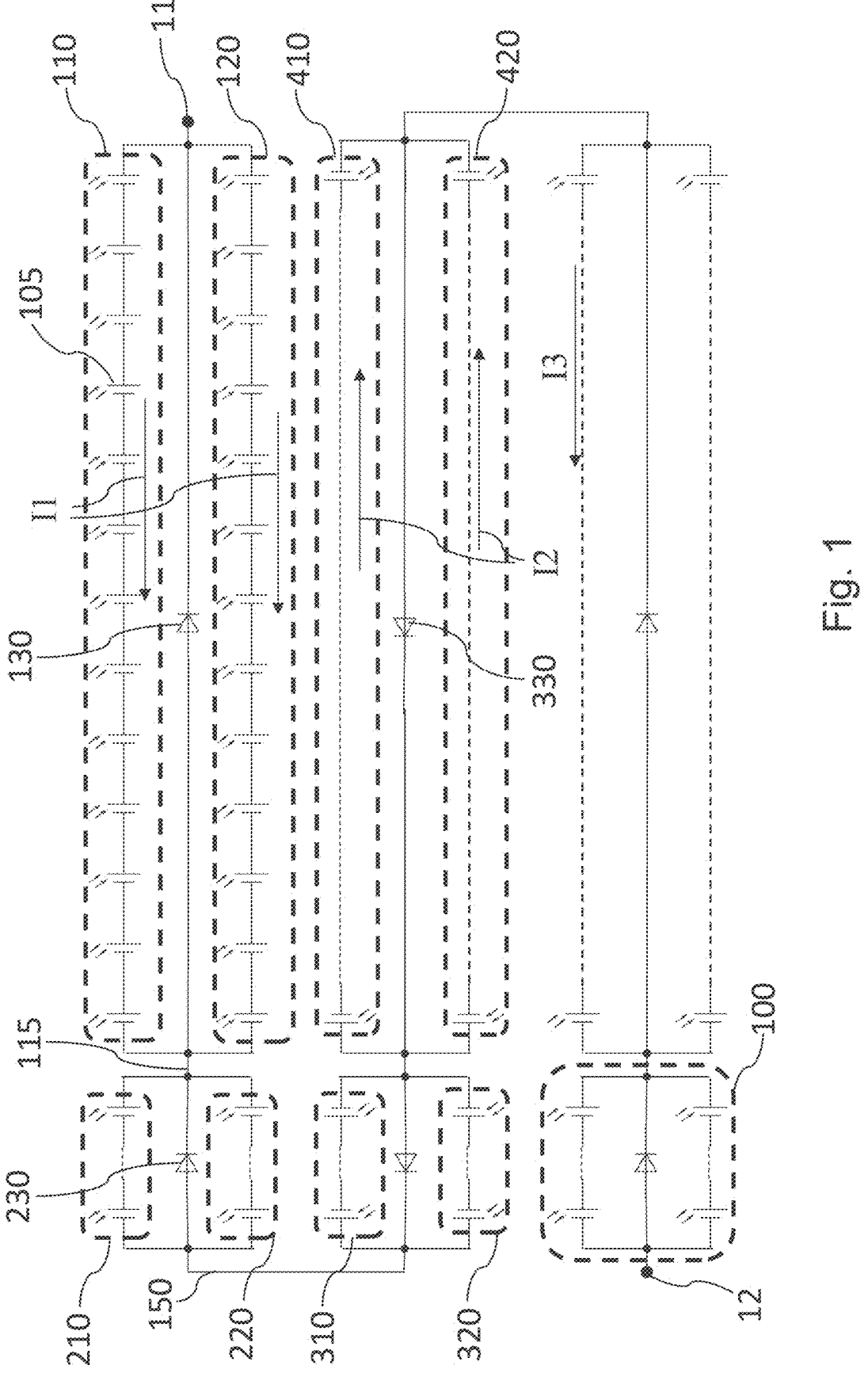
FIG. 1 shows the circuitry of a photovoltaic module with bypass diodes according to an embodiment of the present invention.

FIG. 1 shows a photovoltaic module according to an embodiment comprising a plurality of cell rows 110, 120, 210, 220 of serially connected photovoltaic cells 105 and a plurality of bypass diodes 130, 230, . . . , connected between a first terminal 11 and a second terminal 12. The cell rows 110, 120, . . . are arranged adjacent to each other perpendicular to a current direction I1 which is formed in the series-connected photovoltaic cells 105 during operation and connected in such a way that at least two adjacent cell rows 110, 120 comprise a same current direction I1.

Specifically, a first cell row 110 is arranged in parallel with another first cell row 120, with a first current direction I1 being generated in operation in the two first cell rows 110, 120. Downstream thereof, two second cell rows 210, 220 of solar cells 105 are connected in parallel with each other and serially connected to the two first cell rows 110, 120 via an intermediate connector 115. The serially connected cell rows 110, 120 and 210, 220, respectively, form groups 100 of cell rows.

Perpendicular to the first current direction I1, two further groups of parallel-connected cell rows 310, 320 and 410, 420 are formed via a crosslink 150. This interconnection of solar cells 105 is repeated. However, the electrical crosslink 150 has redirected the second current flow direction I2 so that the second current direction I2 through the second group of cell rows 310, 320 or 410, 420 is opposite to the first (anti-) parallel current direction I1 through the first group of cell rows 110, 120 or 210, 220. Accordingly, the solar cells 105 are oppositely arranged (or oppositely poled).

It is understood that, according to embodiments, the number of solar cells 105 within a cell array 110, 120, . . . can be chosen arbitrarily. Likewise, more than two cell rows 110, 120, . . . may be connected in parallel and/or more than two groups of cells 100 may be connected in series. In this way, the photovoltaic module can be arbitrarily divided into regions that can be switched off by a bypass diode 130, 230, . . . . . This is not possible with the conventional photovoltaic modules of FIG. 4, since there the cell rows extend over half the module height or over the full module height.

According to embodiments, a first bypass diode 130 bypasses the adjacent first cell rows 110, 120, both having the first (same) current direction I1. Similarly, a second bypass diode 230 bypasses the adjacent second cell rows 210, 220 in the subsequent group of cell rows 210, 220, where the two second cell rows 210, 220 also have the same current direction I1 as the first two cell rows 110, 120. It is understood that several small shorter sections can also be formed, which are protected by a bypass diode. In this case, the current direction does not change, but the sections can be accommodated in the module in a meandering manner. Perpendicular to the current direction I1, the arrangement is continued by the meander-shaped arrangement of the cell rows mirror-inverted (the mirror plane is perpendicular to the current direction), so that all cell rows are connected in series and fill the whole module area sensibly.

Figure 4:
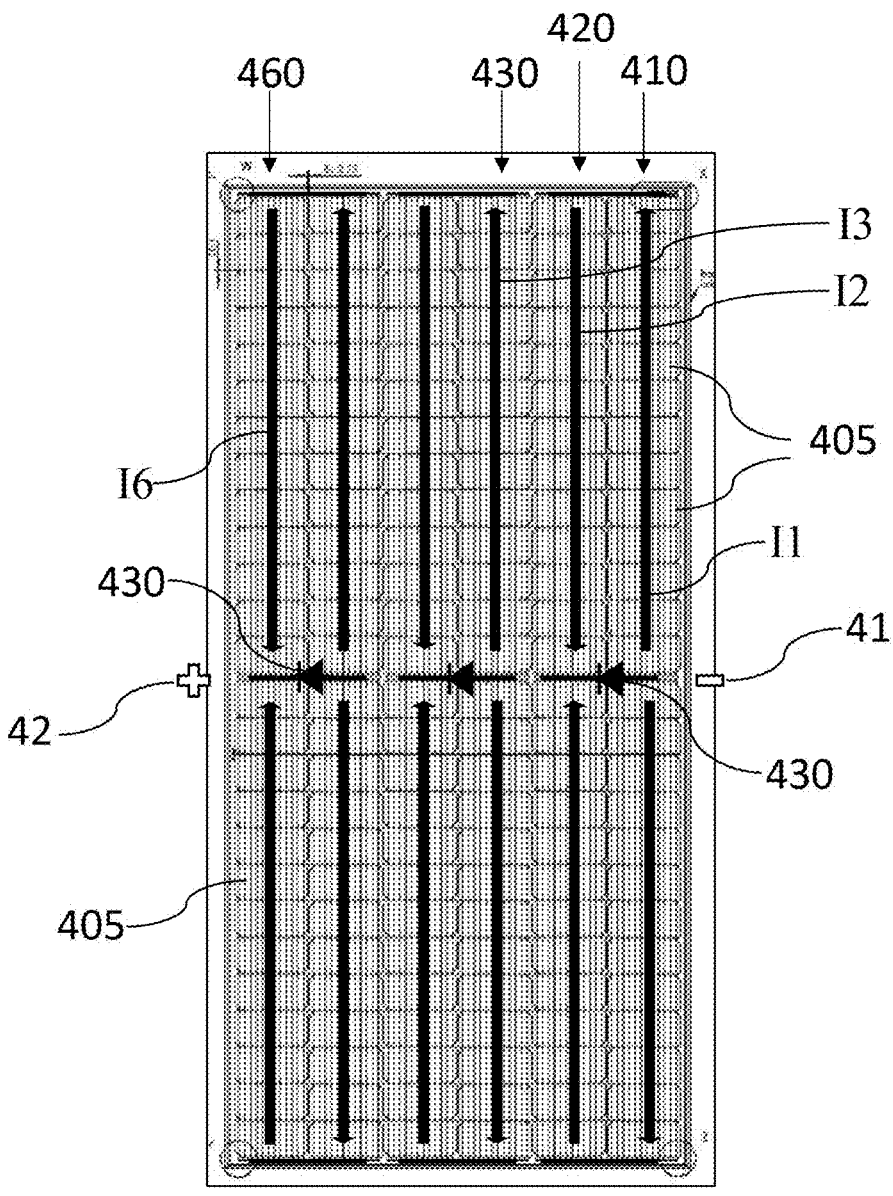
FIG. 4 shows a photovoltaic module with conventionally arranged bypass diodes.

Thus, embodiments differ fundamentally from the conventional photovoltaic modules shown in FIG. 4, where the bypass diodes bridge cell rows with mirrored opposite current directions.

Figure 2:
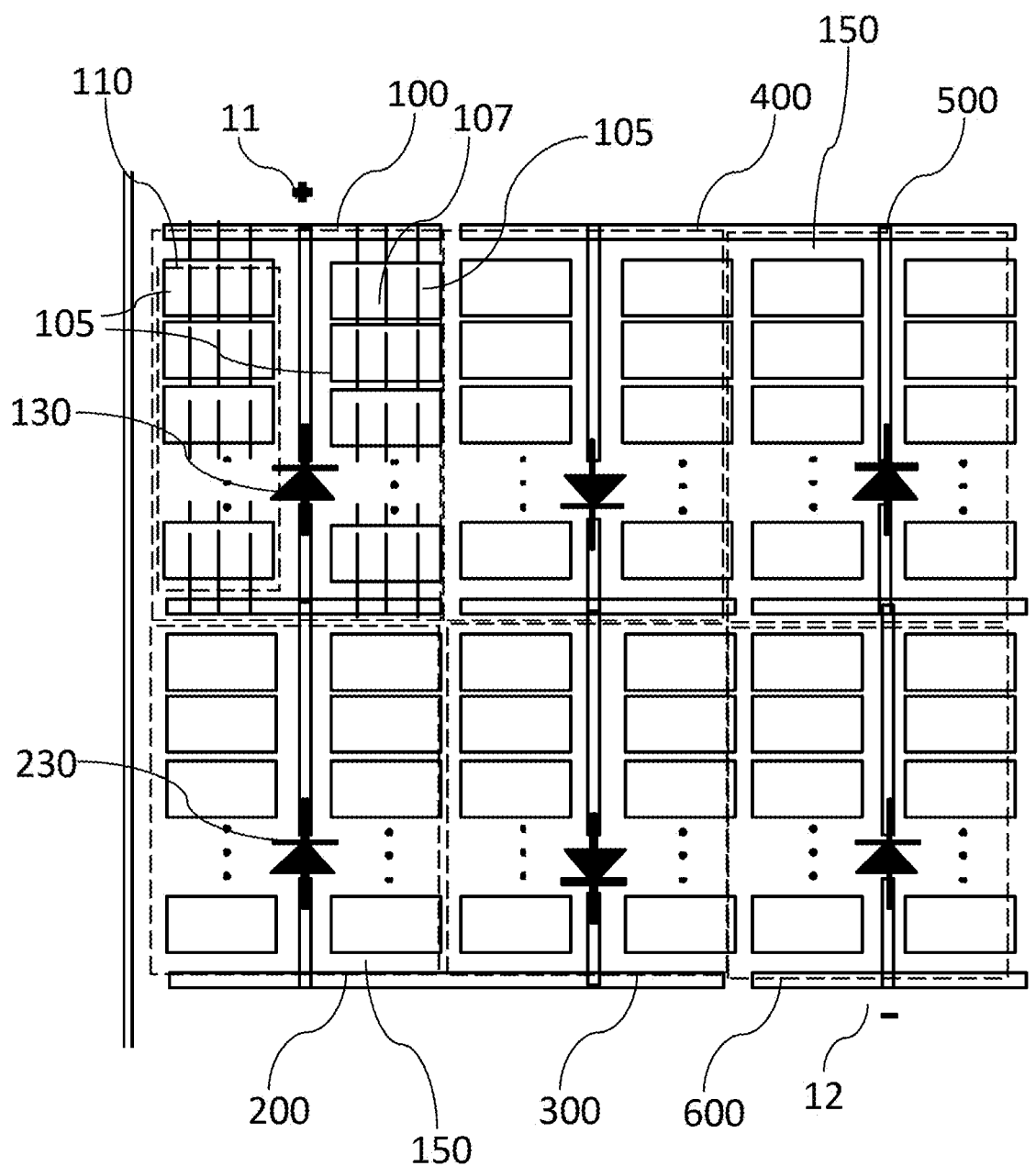
FIG. 2 shows a schematic circuitry of solar cell groups with bypass diodes according to a further embodiment.

FIG. 2 shows a schematic representation of the arrangement of groups 100, 200, . . . 600 of cell rows 110 between the first terminal 11 and the second terminal 12, as they may be arranged on a photovoltaic module according to embodiment. Each group 100, 200, . . . of cell rows 110 includes two or more cell rows 110 of photovoltaic cells 105 connected in parallel (see also FIG. 1). The groups of cell rows 100, 200, . . . are all serially connected, with exemplary two serially connected groups 100, 200 (or 300 and 400 or 500 and 600) shown in the vertical direction and exemplary three groups shown side by side in the horizontal direction. The serial interconnection of all groups 100, 200, . . . is ensured via the crosslinks 150.

It is understood that this embodiment represents only one example. In further embodiments, more than two cell rows within a group 100, 200, . . . may be connected in parallel. Likewise, it is possible that more than three groups are arranged next to each other in the horizontal direction, or that more or less than two groups of cell rows can be arranged in the vertical direction.

According to an advantageous embodiment, the bypass diodes 130, 230 are arranged on a rear side of the photovoltaic module, wherein the corresponding contacting points are routed to the rear side via lines. In addition, it is advantageous if the bypass diodes 130, 130 are accommodated, for example, in only one housing (e.g., the junction box). However, the bypass diodes 130, 230 can be arranged at any position on the rear side, and it is advantageous to arrange them at least along one line (side by side).

In addition, advantageously, no space is formed between the cell rows 110 or the groups 100, 200, . . . in order to be able to use light irradiation on the front side to the maximum. The cell rows 110, . . . or the groups 100, 200, . . . can, for example, abut each other except for an insulation.

According to embodiments, the photovoltaic cells 105 are electrically connected in series via connectors 107. However, it is also possible that the photovoltaic cells 105 are placed on top of each other at the edges and thus serially connected by means of shingles in order to utilize an available area to the maximum and to enable simple manufacturing.

Figure 3:
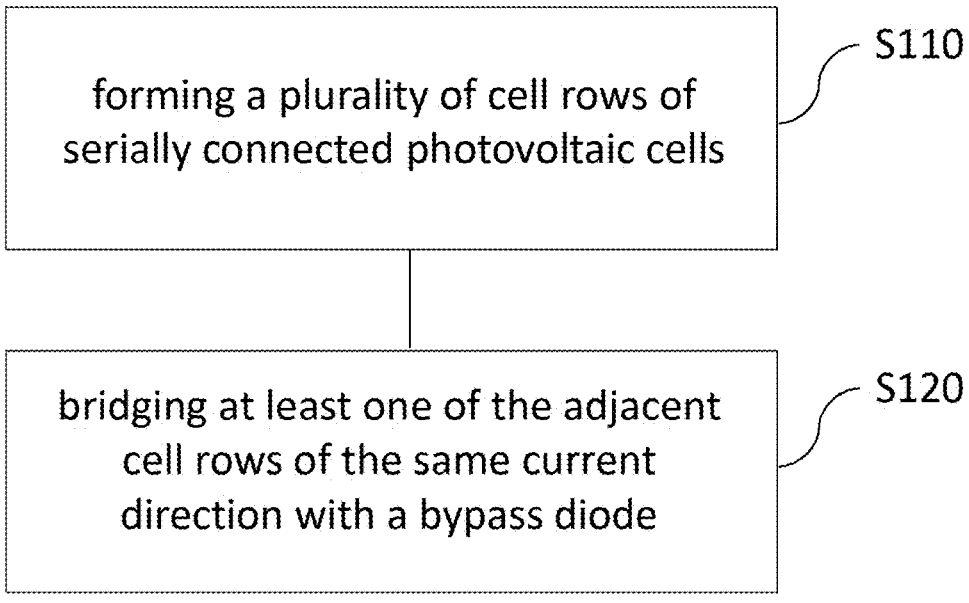
FIG. 3 shows a schematic flow diagram for a method of manufacturing a photovoltaic module according to an embodiment.

FIG. 3 shows a schematic flowchart for a method of manufacturing the photovoltaic module. The method includes:

Forming S110 a plurality of cell rows of serially connected photovoltaic cells, the cell rows being perpendicular to a current direction; and Bridging S120 of at least one of the adjacent cell rows of the same current direction I1 by means of one or more bypass diodes.

It is understood that according to further embodiments all previously mentioned features of the photovoltaic module can be implemented as optional method steps in the method.

Embodiments provide the following advantages, among others:

Very large photovoltaic modules with very high outputs can be switched off in sections in a targeted manner. This provides maximum protection for the photovoltaic cells. The number of cells protected by a bypass diode 130, 230, . . . can be selected almost arbitrarily. In the specific case, an acceptable compromise is to be found between a high level of protection for the cells and the expense with regard to the additional bypass diodes.

In principle, embodiments allow all cells within a cell row 110, 120, . . . to be protected in a simple manner. A major disadvantage of conventional photovoltaic modules is that the cell rows to be protected extend at least over half the module height. In contrast to these conventional solutions, where two whole cell rows are always protected by a bypass diode, in the embodiments it is possible to reduce the number of cells within a cell row. In other words, the photovoltaic module can be partitioned into protection areas as desired.

Finally, embodiments are readily implementable because lines can be readily formed on the backside to bridge the diodes between the parallel cell rows.

The features of the invention disclosed in the description, the claims and the figures may be essential to the realization of the invention either individually or in any combination.

LIST OF REFERENCE SIGNS 11, 12 terminals
41, 42 terminals of a conventional photovoltaic module
105, 405 photovoltaic cells
100, 200, . . . groups of cell rows
110, 120, . . . , 410, 420, . . . cell rows of serially connected photovoltaic cells
107 connector
115 intermediate connector
130, 230, . . . bypass components (e.g. diodes)
150 crosslink
430 conventionally connected bypass diodes
I1, I2, I3, . . . current directions

The invention claimed is:

1. A photovoltaic module, comprising:

a plurality of cell rows of serially-connected photovoltaic cells, wherein the cell rows are arranged adjacent to each other perpendicular to a current direction, which is formed in the serially-connected photovoltaic cells during operation, and are connected in such a way that at least two adjacent cell rows comprise a same first current direction and other cell rows adjacent to one another comprise second current direction, the first current direction being opposite to the second current direction; and one or more bypass components bridging at least one of the adjacent cell rows of the same current direction; and only one junction box as contact point to electrically contact the photovoltaic module, wherein the plurality of rows are arranged adjacent to each other without gaps and the one or more bypass components are arranged opposite to a light incidence direction on a rear side of the photovoltaic module wherein the one or more bypass components are housed in a laminate of the photovoltaic module with the cell rows and include at least one of the following:

a bypass diode, a transistor, and an electronic circuit.

2. The photovoltaic module according to claim 1, wherein at least two cell rows with the same current direction are connected in series along the same current direction.

3. The photovoltaic module according to claim 1, wherein the one or more bypass components are arranged side by side perpendicular to the current direction.

4. The photovoltaic module according to claim 1, wherein the one or more bypass components are arranged anti-parallel to the current direction of at least two adjacent cell rows of the same current direction.

5. The photovoltaic module according to claim 1, wherein the only one junction box is positioned in a corner region of the photovoltaic module for electrically connecting the photovoltaic module.

6. A method of manufacturing a photovoltaic module, the method including:

forming a plurality of cell rows of serially-connected photovoltaic cells, the cell rows being arranged adjacent to each other perpendicular to a current direction formed through the serially-connected photovoltaic cells during operation and connected such that at least two adjacent cell rows comprise a same first current direction and other adjacent cell rows comprise another second current direction, the first current direction being opposite to the second current direction; and bridging, using one or more bypass components, of at least one of the adjacent cell rows of the same current direction, wherein the plurality of rows are arranged adjacent to each other without gaps and the bypass components are arranged opposite to a light incidence direction on a rear side of the photovoltaic module, wherein the photovoltaic module is electrically contacted only by one junction box as contact point, wherein the one or more bypass components are housed in a laminate of the photovoltaic module with the cell rows and include at least one of the following: a bypass diode, a transistor, and an electronic circuit.

* * * * *